United States Patent
Ophir et al.

(10) Patent No.: US 7,117,427 B2
(45) Date of Patent: Oct. 3, 2006

(54) REDUCED COMPLEXITY DECODING FOR TRELLIS CODED MODULATION

(75) Inventors: Lior Ophir, Herzlia (IL); Itay Lusky, Hod Hasharon (IL)

(73) Assignee: Texas Instruments Incorporated, Dallas, TX (US)

( * ) Notice: Subject to any disclaimer, the term of this patent is extended or adjusted under 35 U.S.C. 154(b) by 495 days.

(21) Appl. No.: 10/616,073

(22) Filed: Jul. 9, 2003

(65) Prior Publication Data

US 2005/0010855 A1    Jan. 13, 2005

(51) Int. Cl.
*H03M 13/03*    (2006.01)
(52) U.S. Cl. ............................. 714/796; 714/795
(58) Field of Classification Search .......... 714/796, 714/795
See application file for complete search history.

(56) References Cited

U.S. PATENT DOCUMENTS

| | | | |
|---|---|---|---|
| 5,469,452 A * | 11/1995 | Zehavi | 714/792 |
| 6,005,898 A * | 12/1999 | Kaewell, Jr. | 375/341 |
| 6,236,685 B1 * | 5/2001 | Oppedahl | 375/265 |
| 6,883,021 B1 * | 4/2005 | Ahmed et al. | 709/213 |

* cited by examiner

*Primary Examiner*—Albert Decady
*Assistant Examiner*—Mujtaba K. Chaudry
(74) *Attorney, Agent, or Firm*—Steven A. Shaw; W. James Brady; Frederick J. Telecky, Jr.

(57) ABSTRACT

The present application describes a method of implementing a Viterbi algorithm (VA) for trellis coded modulation (TCM) decoding in communication equipment. According to an embodiment, a branch metric is calculated by adding the absolute value of the real and imaginary parts of a complex vector resulting from the subtraction of a received symbol and a constellation point that is the closest to the symbol in each subset.

16 Claims, 5 Drawing Sheets

REDUCED COMPLEXITY DECODING FOR TRELLIS CODED MODULATION

BACKGROUND OF THE INVENTION

1. Field of the Invention

This invention relates generally to digital communication systems and methods, and more particularly to a method of implementing a Viterbi algorithm (VA) for trellis coded modulation (TCM) decoding, optionally in association with a digital signal processor (DSP) or other data processor.

2. Description of the Prior Art

Figure 1:
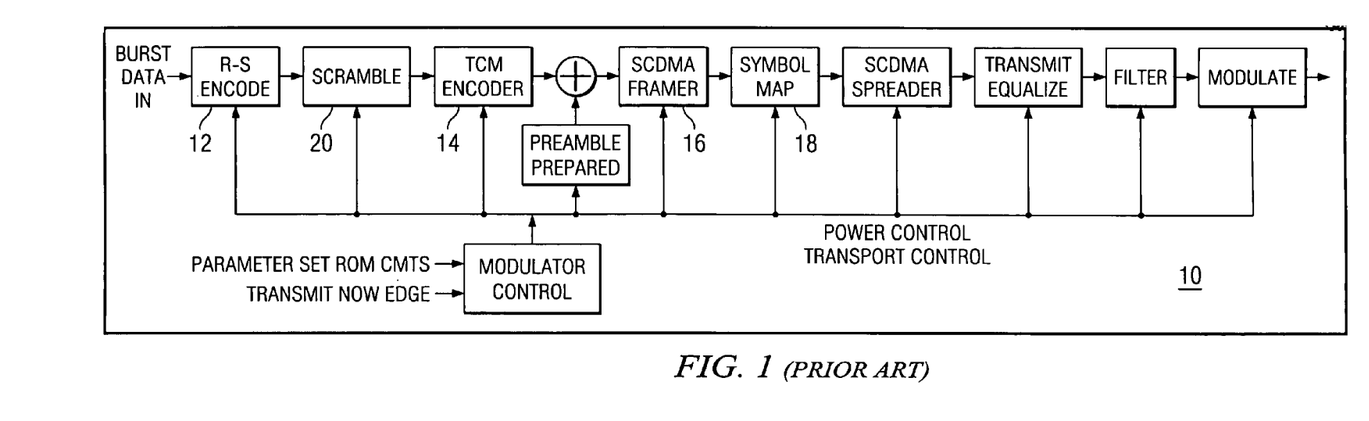
FIG. 1 illustrates a SCDMA mode signal processing sequence for a burst type transmitter.

The upstream physical layer of the new DOCSIS 2.0 specification uses advanced time-division multiple access (A-TDMA) or synchronous code-division multiple access (SCDMA) burst type formats. For SCDMA, the signal processing sequence for the transmitter 10 is illustrated in FIG. 1. The modulation scheme includes Reed-Solomon (RS) encoding 12, optional trellis coded modulation (TCM) coding 14, a unique SCDMA framing scheme 16, and symbol mapping 18 into various constellations depending on the TCM mode used. Furthermore, in TCM mode, a special RS-bytes to TCM-input-bits mapping is used at the TCM encoder input.

In view of the foregoing, it would be both desirable and advantageous in receiver applications, for example burst receiver such as the SCDMA burst receiver implemented, for example, in DOCSIS2.0 standard, to provide a method of implementing a Viterbi algorithm (VA) for trellis coded modulation (TCM) decoding, optionally in association with a digital signal processor (DSP) or other data processor.

SUMMARY OF THE INVENTION

The present invention is directed to a method of implementing a Viterbi algorithm (VA) for trellis coded modulation (TCM) decoding, optionally in association with a digital signal processor (DSP) or other data processor.

According to one embodiment, a method of reduced complexity TCM decoding comprises the steps of a) receiving a soft symbol; b) choosing a constellation point closet to the received soft symbol for each TCM subset; c) calculating the metric of each branch based on the distance (for example squared Euclidean distance) of the chosen point from the received symbol; d) calculating new state metrics for each trellis state, as the minimum of the sums of all possible (previous state+appropriate branch) that lead to a new state; e) selecting the state with the smallest metric; and f) tracing back from the state with the smallest metric, to determine the state and appropriate transmitted symbol(s) having a delay based on the traceback length, and repeating these steps for each received symbol.

According to another embodiment, the distance in step c) above is other than the squared Euclidean distance, for example that of Eq. 2 hereafter.

According to another embodiment, step b) and c) above are performed only for some TCM subsets (for example 4 out of 8 subsets, for which the received symbol is closest to), whereas for all other subsets, the distance in step c) is replaced by a saturated distance depending on the constellation.

According to another embodiment, step b) and c) above are performed only for some TCM subsets (for example 4 out of 8 subsets, for which the received symbol is closest to), and also the distance in step c) above is other than the squared Euclidean distance, for example that of Eq. 2 hereafter, whereas for all other subsets, the distance in step c) is replaced by a saturated distance depending on the constellation.

According to another embodiment, a method comprises implementing a VA or reduced complexity VA on a DSP.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawing figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

TCM Coding Scheme in SCDMA

Figure 2:
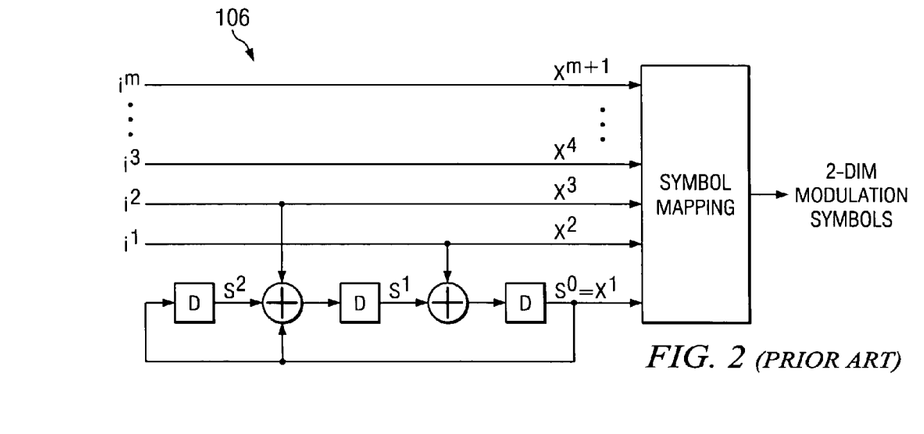
FIG. 2 illustrates a TCM encoder for SCDMA operating mode.
Figure 3:
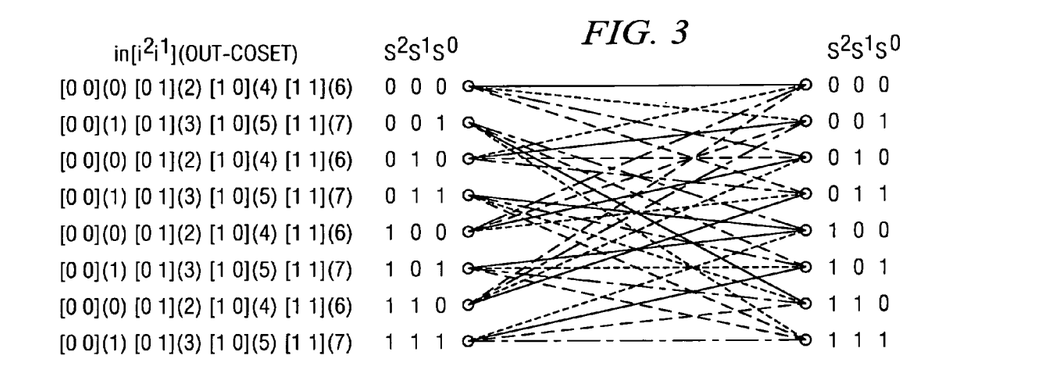
FIG. 3 shows an 8-state, 2-branch trellis for SCDMA operating mode with QPSK constellation.
Figure 4:
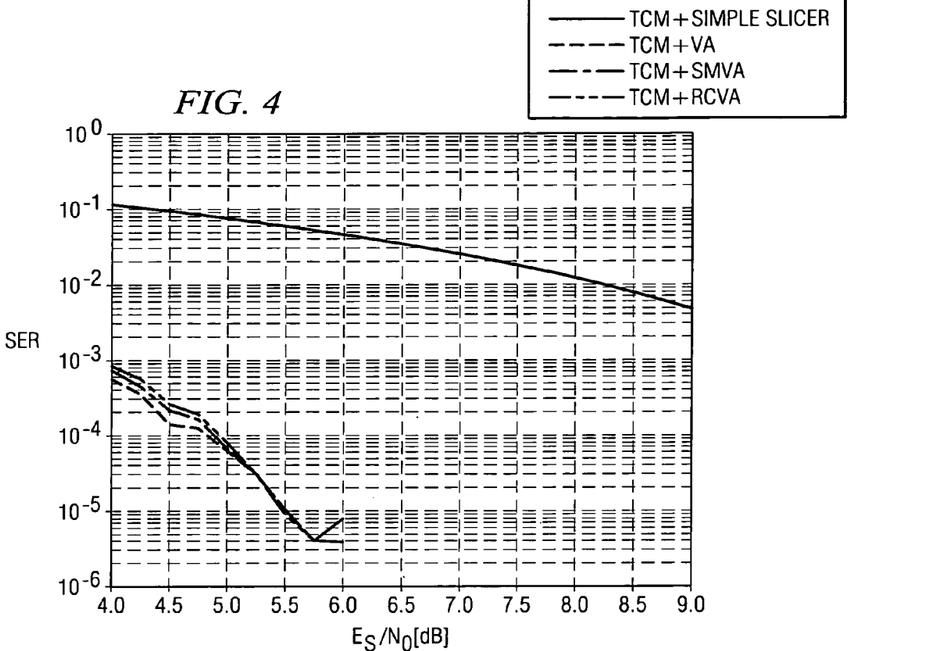
FIG. 4 shows graphical simulation results for uncoded operation and also for various TCM coding in the transmitter for SCDMA operating mode using one information bit per symbol.
Figure 5:
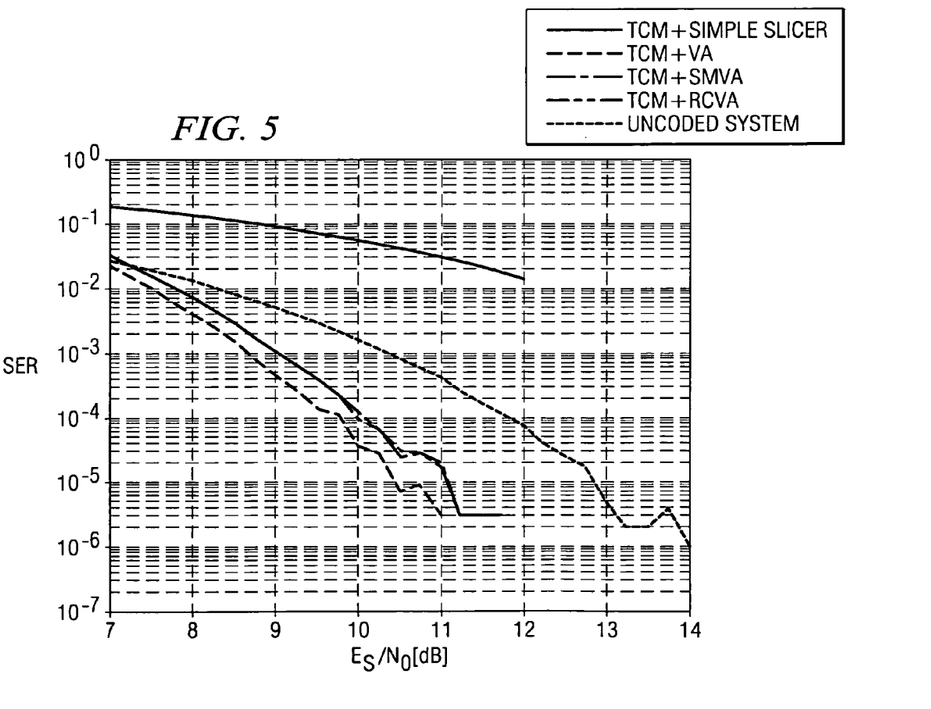
FIG. 5 shows graphical simulation results for uncoded operation and also for various TCM coding in the transmitter for SCDMA operating mode using two information bits per symbol.
Figure 6:
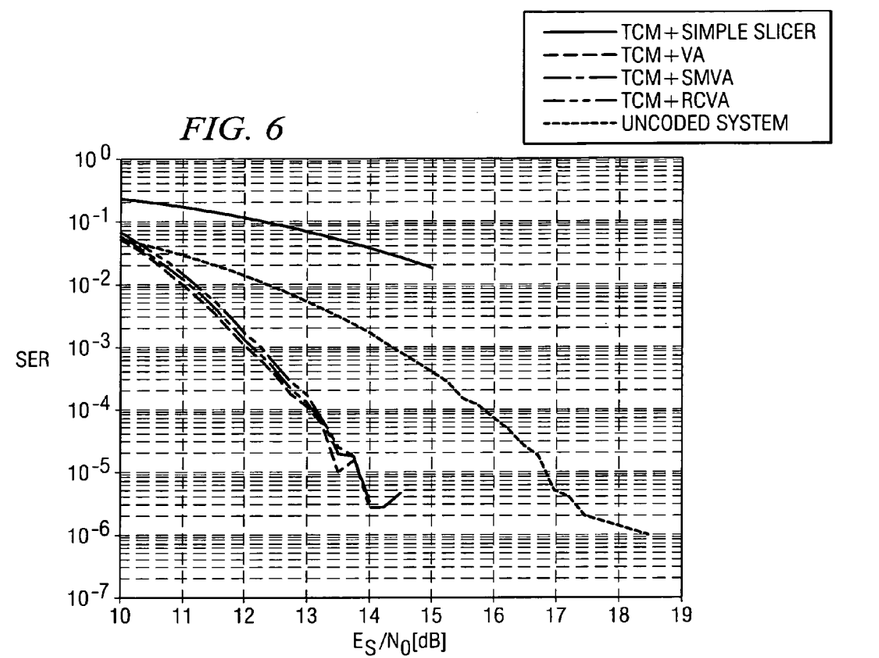
FIG. 6 shows graphical simulation results for uncoded operation and also for various TCM coding in the transmitter for SCDMA operating mode using three information bits per symbol.
Figure 7:
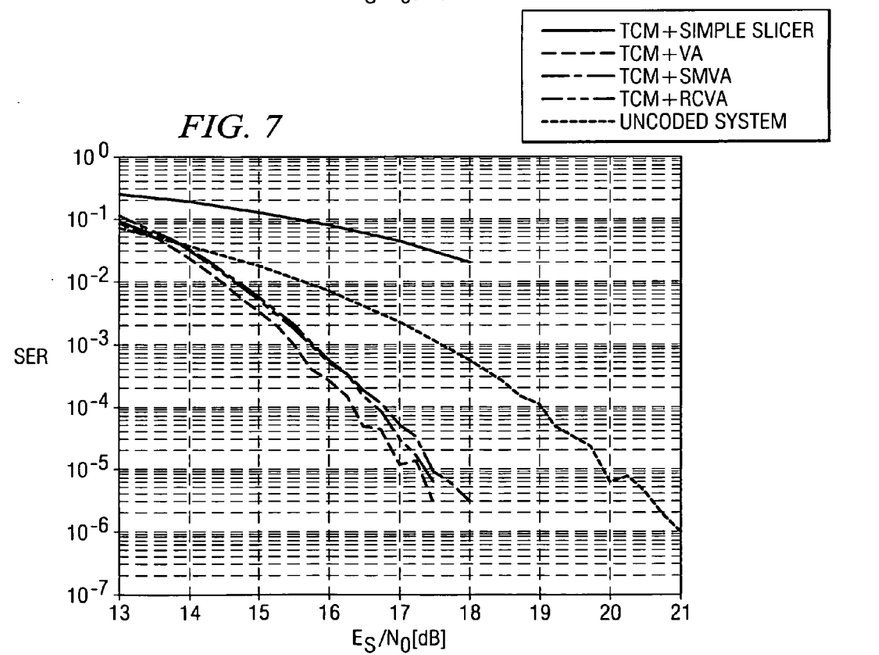
FIG. 7 shows graphical simulation results for uncoded operation and also for various TCM coding in the transmitter for SCDMA operating mode using four information bits per symbol.
Figure 8:
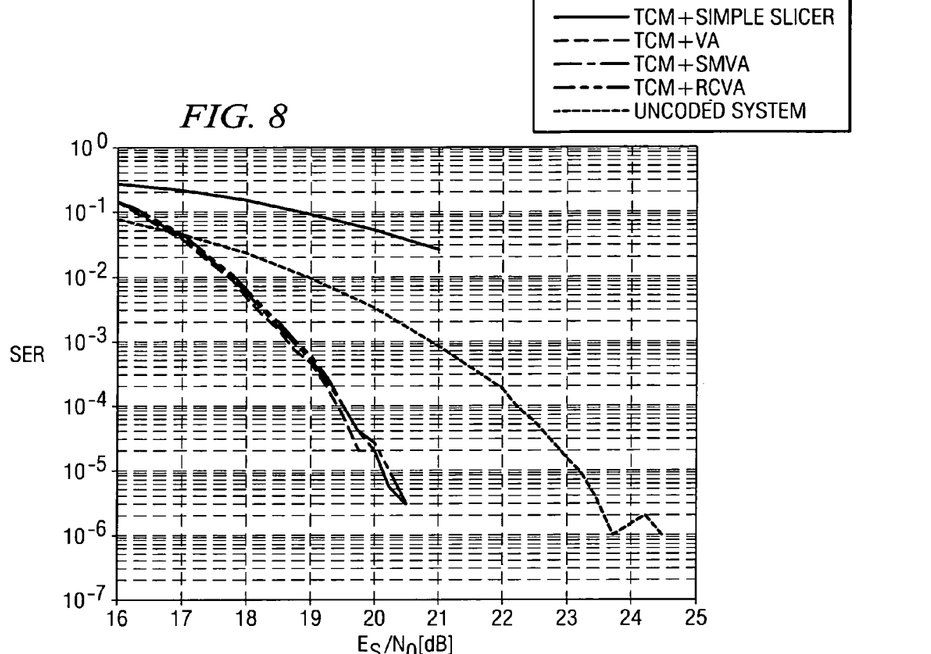
FIG. 8 shows graphical simulation results for uncoded operation and also for various TCM coding in the transmitter for SCDMA operating mode using five information bits per symbol.
Figure 9:
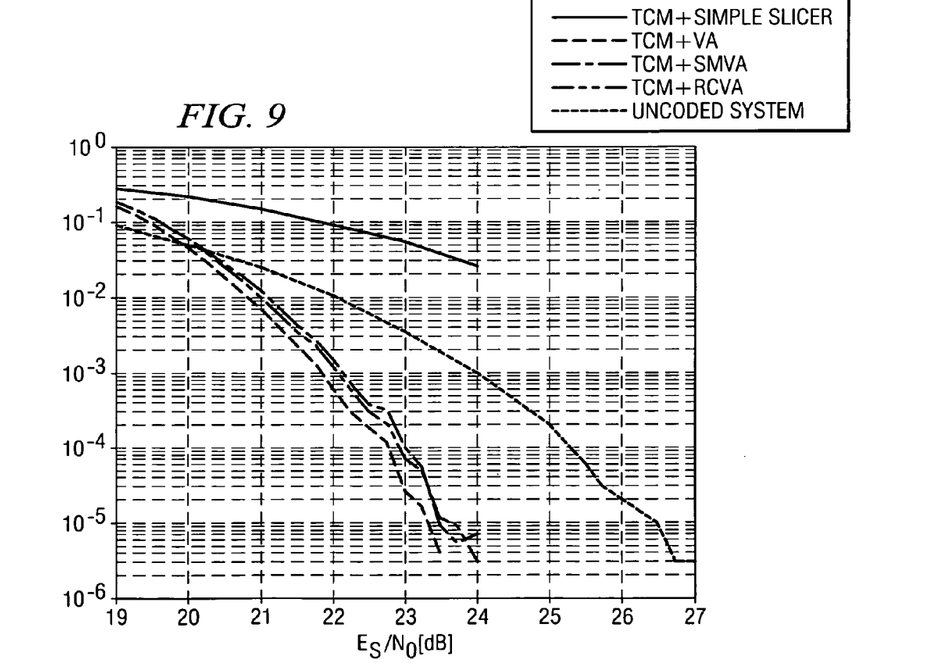
FIG. 9 shows graphical simulation results for uncoded operation and also for various TCM coding in the transmitter for SCDMA operating mode using six information bits per symbol.
Figure 11:
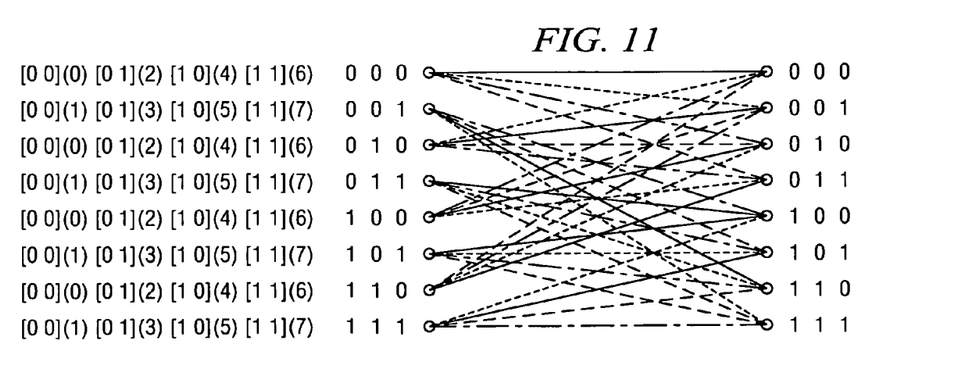
FIG. 11 shows an 8-state, 4-branch trellis for SCDMA operating mode with constellation other than QPSK.

In the SCDMA operating mode, the cable modem (CM) must support trellis coded modulation (TCM) for transmission of 1,2,3,4,5, or 6 information bits per symbol using QPSK, 8QAM, 16QAM, 32QAM, 64QAM, and 128QAM respectively. FIG. 2 shows an 8-state TCM encoder 106 that was employed by the present inventors during a simulation. The convolutional encoder is of rate ½ for QPSK and rate ⅔ for all other constellations. Hence, there are four subsets for QPSK and eight subsets for all other constellations. The uncoded bits are used to select between constellation points in the same subset. The respective trellis is depicted in FIG. 3 for QPSK (with 8 states, 2 branches leaving each state) and in FIG. 11 for non-QPSK constellations (with 8 states, 4 branches leaving each state).

TCM Coding in the Transmitter VA Decoding in the Receiver

This is the optimal receiver operation for the coding subsystem, when TCM encoding is turned on. The decoder uses Viterbi algorithm, with 8-state trellis and 2 or 4 branches leaving each state for QPSK and all other constellations respectively. Basically there are 8 slicing operations (none for QPSK and 8QAM), and 8 branch metric calculations (4 for QPSK) for each iteration. For state metric calculations there are (4 branch*8 state)=32 additions, and for each state 4 comparisons to derive the best previous state. A thorough description and considerations regarding implementation on DSP are discussed herein below. This suggests that 16 clocks are needed per symbol to perform the branch metric calculation. The branch metric calculation is based on the square Euclidean distance between the received symbol and the closest symbol in each subset, and follows Equation (1) below.

Eq. (1):

Branch metric calculation for full VA $$B_i = \|z - \hat{a}_i\|^2$$

$$i = \begin{cases} 0, 1, 2, 3 & \text{for } QPSK \\ 0, 1, 2, 3, 4, 5, 6, 7 & \text{for all other constellations} \end{cases}$$

Where:

$B_i$ is the branch metric for the i'th subset z is the received soft symbol $\hat{a}_i$ is the constellation symbol belonging to the i'th subset, which is closest to the received symbol.

TCM Coding in the Transmitter, Simplified Metric VA (SMVA) Decoding in the Receiver This is a novel suboptimal receiver operation for a TCM modulation subsystem. One example is described herein below for an 8-state TCM code used in SCDMA transmission associated with the Docsis2.0 standard. The present invention is not so limited however, and it shall be understood the method described is general.

The decoder uses a simplified metric Viterbi algorithm (SMVA), with an 8-state trellis and 2 or 4 branches leaving each state for QPSK and all other constellations respectively. Basically, there are 8 slicing operations (no slicing for QPSK and 8QAM), and 8 branch metric calculations (4 for QPSK) for each iteration. For state metric calculations, there are (4 branch*8 state)=32 additions, and for each state, 4 comparisons to derive the best previous state. A thorough description and considerations regarding implementation on DSP are discussed herein below. In SMVA, the branch metric is calculated by using a simplified metric for the distance between the received soft symbol and the closest symbol in each subset. One option for a simplified metric is adding the absolute value of the real and imaginary parts of the complex vector resulting from the subtraction of the received symbol and the closest symbol in each subset, and follows Equation 2 below. Following DSP implementation, the number of clock cycles needed per symbol to perform the simplified branch metric calculation is reduced from 16 to 8. The degradation in performance is evaluated via simulation. Notice that other simplified metrics can also be used.

$$B_i = |\text{real}\{z - \hat{a}_i\}| + |\text{imag}\{z - \hat{a}_i\}| \qquad \text{Eq. (2)}$$

$$i = \begin{cases} 0, 1, 2, 3 & \text{for } QPSK \\ 0, 1, 2, 3, 4, 5, 6, 7 & \text{for all other constellations} \end{cases}$$

where:

$B_i$ is the branch metric for the i'th subset, z is the received soft symbol, and $\hat{a}_i$ is the constellation symbol belonging to the i'th subset, which is closest to the received symbol.

TCM Coding in the Transmitter, Reduced Complexity VA (RCVA) Decoding in the Receiver This is a novel suboptimal receiver operation for a TCM modulation subsystem. One example is described herein below for an 8-state TCM code used in SCDMA transmission associated with the Docsis2.0 standard. The present invention is not so limited however, and it shall be understood the method described is general.

The decoder uses a reduced complexity Viterbi algorithm (RCVA), with an 8-state trellis and 2 or 4 branches leaving each state for QPSK and all other constellations respectively. Basically there are 8 slicing operations (no slicing for QPSK and 8QAM), and 8 branch metric calculations (4 for QPSK) for each iteration. For state metric calculations, there are (4 branch*8 state)=32 additions, and for each state, 4 comparisons to derive the best previous state. A thorough description and considerations regarding implementation on DSP is discussed herein below. In RCVA, only the metrics for the subsets of some (for example four) symbols closest to the received symbol are calculated. The metrics for all other subsets are set to a predefined ("saturated") value, set independently for each constellation. For received symbols that are "outside" of the constellation—only two metrics are calculated; metrics for all other subsets (2 for QPSK, 6 for all other constellations) are saturated. The saturation values for each constellation were set according to some preliminary research. Further research may yield better values, but the present inventors believe that this will enhance performance by not more than 0.1 dB. Based on the constellation and the properties of the TCM coding, the number of subsets for which metrics are calculated can be chosen, and respectively the number of subsets that are using saturated metrics is chosen.

In RCVA, the present inventors further used the simplified metrics as in SMVA, described herein before. Following DSP implementation, it is expected that the number of clock cycles needed per symbol to perform the RCVA branch metric calculation can be reduced from 16 to 4. The degradation in performance is evaluated via simulation.

Simulation Results

Based on simulation results, the symbol error rate (SER) for each transmission rate is shown in FIGS. 4–9. For each transmission rate (measured in information bits per symbol), the five plots follow five scenarios, including 1) uncoded operation; 2) TCM coding in the transmitter, VA decoder in the receiver; 3) TCM coding in the transmitter, simplified metric VA (SMVA) in the receiver; 4) TCM coding in the transmitter, reduced complexity VA (RCVA) in the receiver; and 5) TCM coding in the transmitter, simple slicing decoder in the receiver. In each simulation, more than 1,000,000 symbols were generated (with the appropriate number of bytes, according to the constellation size).

Conclusions

The simulation results shown in FIG. 4–FIG. 9, suggest that the TCM coding scheme, introduced to SCDMA mode of DOCSIS2.0, yields a coding gain of 2–3dB at le-4>SER>le-6. The asymptotic coding gain of this scheme at high SNR can be seen to approach 4 dB (5 dB for QPSK); but on the other hand, when RS-coding is concatenated with TCM, SER=le-4 at the TCM decoder output seems like a reasonable operating point.

The simulation results emphasize the negligible performance degradation of using either SMVA or RCVA decoding, instead of a full VA. The degradation is only a few tenths of a dB, whereas the complexity reduction is up to 12 clock cycles per symbol for a DSP implementation as discussed herein below. In some cases this can enable implementation of a receiver (for example the DOCSIS2.0 S-CDMA burst receiver) on a DSP.

Implementing a VA for TCM Decoding on a DSP

DSP based implementation is based on block base processing. The following is a high-level description of the Viterbi algorithm employed. At each iteration, the following should most preferably be performed:
1. receive soft symbol;
2. for each TCM subset, choose the constellation point closest to the received symbol; and
3. calculate the squared Euclidean distance of this selected point from the received symbol (steps 2,3 actually choose between parallel branches between states in the trellis, and give branch metrics to each branch).
4. Go over each trellis states and calculate new state metrics as the minimum of the sums of all possible (previous state+appropriate branch) that lead to this state.
5. (this can be done at each iteration or in a batch manner:) Select the state with the smallest metric, and trace back from this state to decide in the state and appropriate transmitted symbol(s) with delay based on the traceback length.
6. Go back to step 1.

Steps 2 and 3 are discussed herein below in further detail, and describe one technique for implementing the known Viterbi algorithm using a DSP.

Trellis Parallel Paths Selection and Metric Calculation

One example is described herein below for an 8-state TCM code used in SCDMA transmission associated with the Docsis2.0 standard. The present invention is not so limited however, and it shall be understood the method described is general.

Figure 10:
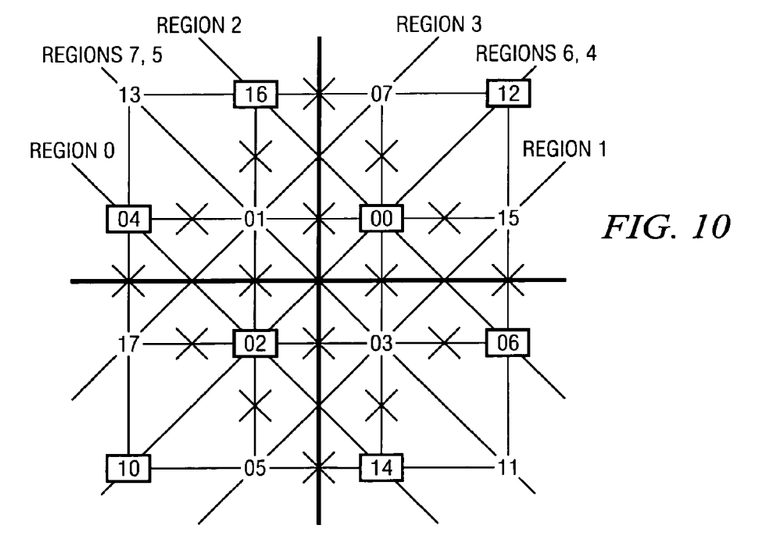
FIG. 10 depicts an example of TCM region partitioning for a 16QAM constellation.

Each trellis stage requires choosing the minimal metric out of $2^i$ parallel paths, where i is the number of uncoded bits in a symbol. This should be done to all 8 subsets for SCDMA. Two methods can be considered:
1) Performing 8 slicer operations, one for each subset. This is a high MIPS consuming option since each slicer operation can use an un-squared constellation requiring 10–12 clocks/symbol/subset.
2) Divide the constellation space to regions, so that trellis metrics located within this region should be calculated related to the same 8 symbols. An example for region partitioning for 16QAM constellation can be seen in FIG. 10. For example: "Region 3" line divides the IQ plane into two areas, where all soft decisions falling to the left of the "Region 3" line should be sliced related to symbol "13" (i.e.—uncoded symbol is "1") and all soft decisions falling to the right of "Region 3" line should be sliced related to symbol "03" (i.e.—uncoded symbol is "0"). Using this method for every received symbol, a slicing operation is done based on these regions, where this slicing operation simultaneously selects the best symbol in each of the 8 subsets. The distance between the received symbol and the selected constellation point in each subset is calculated based on the:
  a. Distance of the received symbol and the "region representing point" representing each of the regions (see crosses in FIG. 10). This is calculated per each received symbol.
  b. b. Distance of the "region representing point" and the corresponding constellation point in each subset (as the regions were defined, there is only one point per subset). This is calculated a priori, and can be stored in a look-up table.

Detailed Operation (Performance Analysis)

Operations required and estimated DSP clock cycles required for a C64×DSP available from Texas Instruments Incorporated of Dallas, Texas are considered.

For 16QAM and 64QAM: rotate received symbol by PI/4 so a simple slicing operation would determine the relevant region MIPS estimation:~1 clock/symbol.

Perform saturation for the rotated symbol so only relevant regions would be generated after slicing. For example, in FIG. 10, saturation is required to achieve only 16 valid slicer outputs. For very large constellations, neglecting this step might be possible and will result in negligible performance degradation. MIPS estimation: ~1 clock/symbol.

Perform slicing operation. MIPS estimation: Only square constellation slicing is required for all possible constellations, resulting with~3–4 clocks/symbol.

Find distance from received symbol to region center ("'Initial_Distance"). MIPS estimation: This involves subtraction for I and Q. ~1 clocks/symbol.

Use region decision as an index for a look-up table. This table holds for each region the distances from region center to each of the 8 constellation point within that region. Add each loaded metric to Initial_Distance and raise to the power. Add I squared distance to Q squared distance. Store 8 generated metrics to Viterbi memory. MIPS estimation: 2[clocks/region points]*8[points in a region]=~16 clocks/symbol.
  Using SMVA reduces this to ~8 clocks/symbol since the squaring operation is not done.
  Using RCVA further reduces this to ~4 clocks/symbol since this is done only for 4 subsets instead of 8.

Memory estimation: All the regions for all constellations are required to be in memory. The numbers of regions is 16, 25, 144, 169 for 16QAM, 32QAM, 64QAM and 128QAM respectively. Therefore the total number of required regions is 354 regions. Assuming each region holds for each symbol 12 bits/dimension, the required memory is 354 [regions]*8 [metrics/region]*2 [I/Q]*12/8 [bytes/metric]=~8.5 Kbytes TOTAL MIPS and memory estimation: Regular operation: ~22–23 clocks/symbol, ~8.5 Kbytes.
SMVA:~14–15 clocks/symbol, ~8.5 Kbytes.
RCVA:~10–11 clocks/symbol, ~8.5 Kbytes.

In view of the above, it can be seen the present invention presents a significant advancement in TCM decoding techniques. It should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although a DSP implementation of a VA/SMVA/RCVA has been described in detail herein before, the present invention is not so limited, and can easily be extended to many other implementations.

What is claimed is:

1. A method of TCM decoding, the method comprising the steps of:
    a) receiving a soft symbol;
    b) choosing a constellation point closest to the received soft symbol for each TCM subset;
    c) calculating the metric of each branch based on the distance of the chosen point from the received symbol, wherein the distance is Euclidean distance;
    d) calculating new state metrics for each trellis state as the minimum of the sums of all possible previous states and appropriate branch that lead to a new state;
    e) selecting the state with the smallest metric; and
    f) tracing back from the state with the smallest metric, to determine the state and appropriate transmitted symbol(s) having a delay based on the traceback length,
    wherein steps b and c together choose between parallel branches between states in the trellis, and assign branch metrics to each branch and each branch metric is calculated by adding the absolute value of the real and imaginary parts of the complex vector resulting from the subtraction of the received symbol and the closest symbol in each subset to implement simplified metric VA decoding.

2. The method according to claim 1, further comprising repeating steps a–f for each received soft symbol.

3. The method according to claim 1, wherein only the branch metrics of the subsets of some symbols closest to the received symbol are calculated; and the metrics for all other subsets are set to a predefined (saturated) value, set independently for each constellation.

4. The method according to claim 3, wherein for received symbols outside the constellation, only two metrics are calculated based on the constellation points closest to the received symbol, while metrics for all other subsets are set to a predefined (saturated) value, set independently for each constellation, to implement reduced complexity VA decoding.

5. The method according to claim 4, wherein the branch metric that is calculated is calculated by adding the absolute value of the real and imaginary parts of the complex vector resulting from the subtraction of the received symbol and the closest symbol in the subset to implement reduced complexity simplified metric VA decoding.

6. The method according to claim 1, wherein only the branch metrics of the subsets of the four symbols closest to the received symbol are calculated; the metrics for all other subsets are set to a predefined (saturated) value, set independently for each constellation; and for received symbols outside the constellation, only two metrics are calculated, while metrics for all other subsets are saturated, to implement reduced complexity VA decoding.

7. The method according to claim 6, wherein the branch metric that is calculated is calculated by adding the absolute value of the real and imaginary parts of the complex vector resulting from the subtraction of the received symbol and the closest symbol in the subset to implement reduced complexity simplified metric VA decoding.

8. The method according to claim 1, wherein calculating the metric of each branch based on the distance comprises calculating the squared Euclidean distance.

9. A method of implementing a VA on a DSP, the method comprising the steps of:
    a) receiving a soft symbol;
    b) for each TCM subset, choosing the constellation point closest to the received symbol;
    c) calculating the distance of this selected point from the received symbol, via choosing between parallel branches between states in the trellis, and assigning branch metrics to each branch;
    d) Examining each trellis state and calculating new state metrics as the minimum of the sums of all possible previous states and appropriate branch that lead to this state;
    e) Selecting the state with the smallest metric, and tracing back from this state to decide in the state and appropriate transmitted symbol(s) with delay based on the traceback length; and
    f) Repeating steps a–e,
    wherein steps b and c together choose between parallel branches between states in the trellis, and assign branch metrics to each branch and each branch metric is calculated by adding the absolute value of the real and imaginary parts of the complex vector resulting from the subtraction of the received symbol and the closest symbol in each subset to implement simplified metric VA decoding.

10. The method according to claim 9, wherein step e is selectively repeated at each iteration or in a batch manner.

11. The method according to claim 9, wherein choosing between parallel branches between states in the trellis, and assigning branch metrics to each branch in step c comprises the steps of:
    a. dividing the constellation space into regions, so that trellis metrics located within a region will be calculated related to the same N symbols, where N is the number of subsets in the TCM;
    b. slicing the received symbol, based on these regions, where this slicing operation simultaneously selects the best symbol in each of the N subsets; and
    c. calculating the distance between the received symbol and the selected constellation point in each subset based on the distance of the received symbol and a predefined "region representing point" representing each of the regions, and the distance of the "region representing point" and the corresponding constellation point in each subset that is calculated a priori, and stored in a look-up table.

12. The method according to claim 11 wherein the distance in step c is the squared Euclidean distance.

13. The method according to claim 11, wherein only the branch metrics of the subsets of some symbols closest to the received symbol are calculated; and the metrics for all other subsets are set to a predefined (saturated) value, set independently for each constellation.

14. The method according to claim 11, wherein the distance in step c is calculated by adding the absolute value of the real and imaginary parts of the complex distance vectors to implement simplified metric VA decoding.

15. The method according to claim 14, wherein only the branch metrics of the subsets of some symbols closest to the received symbol are calculated; the metrics for all other subsets are set to a predefined (saturated) value, set independently for each constellation, and wherein for received symbols outside the constellation, only two metrics are calculated based on the constellation points closest to the received symbol, while metrics for all other subsets are set to a predefined (saturated) value, set independently for each constellation, to implement reduced complexity simplified metric VA decoding on a DSP.

16. The method according to claim 15, wherein for received symbols outside the constellation, only two metrics are calculated based on the constellation points closest to the received symbol, while metrics for all other subsets are set to a predefined (saturated) value, set independently for each constellation, to implement reduced complexity VA decoding on a DSP.

* * * * *